(12) United States Patent
Liu et al.

(10) Patent No.: US 10,879,169 B2
(45) Date of Patent: Dec. 29, 2020

(54) INTEGRATED INDUCTORS FOR POWER MANAGEMENT CIRCUITS

(71) Applicant: QUALCOMM Incorporated, San Diego, CA (US)

(72) Inventors: Kai Liu, San Diego, CA (US); Gang Lin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/232,596

(22) Filed: Dec. 26, 2018

(65) Prior Publication Data

US 2020/0211958 A1 Jul. 2, 2020

(51) Int. Cl.
*H01L 23/552* (2006.01)
*H01L 23/522* (2006.01)
*H01L 49/02* (2006.01)
*H01L 23/00* (2006.01)

(52) U.S. Cl.
CPC ........ *H01L 23/5227* (2013.01); *H01L 23/552* (2013.01); *H01L 24/17* (2013.01); *H01L 28/10* (2013.01); *H01L 2224/02371* (2013.01)

(58) Field of Classification Search
CPC ..... H01L 23/00; H01L 23/498; H01L 23/538; H01L 23/552; H01L 23/5227; H01L 23/49838; H01L 23/525; H01L 23/522; H01L 23/5228; H01L 23/647; H01L 23/481; H01L 24/05; H01L 24/16; H01L 24/17; H01L 24/81; H01L 25/50; H01L 25/0657; H01L 2224/023; H01L 2224/02372; H01L 2224/0401; H01L 2224/0231; H01L 2224/0233; H01L 27/281; H01L 27/0688
USPC ..................................... 257/4, 531
See application file for complete search history.

(56) References Cited

U.S. PATENT DOCUMENTS

2006/0126237 A1* 6/2006 Su .................. H02M 3/155
361/56
2017/0187345 A1* 6/2017 Yun ................... H01Q 1/50

* cited by examiner

*Primary Examiner* — Chuong A Luu
(74) *Attorney, Agent, or Firm* — Muncy, Geissler, Olds & Lowe, P.C.

(57) ABSTRACT

A power supply package is disclosed, including a power management integrated circuit (PMIC) die with a plurality of switching circuits, and a plurality of integrated 3-dimensional (3D) inductors disposed around the PMIC die. Each 3D inductor corresponds to a switching circuit and is electrically coupled to first and second connections for the corresponding switching circuit. An integrated electromagnetic interference (EMI) shield is disposed between the PMIC and the 3D inductors.

13 Claims, 10 Drawing Sheets

INTEGRATED INDUCTORS FOR POWER MANAGEMENT CIRCUITS

FIELD OF DISCLOSURE

The present disclosure is related to electronic devices including power management circuits having integrated inductors and in further aspects to electromagnetic shielding of integrated inductors.

BACKGROUND

Integrated circuit (IC) technology has achieved great strides in advancing computing power through miniaturization of active components. Integrated passive components have also been miniaturized, and the trend for further miniaturization of such components continues. Passive inductive elements comprise some of the larger elements in many integrated circuit devices and as such are often implemented off-chip as a surface mounted device (SMD).

In particular, a power supply circuit is often packaged as an integrated circuit (IC) formed on a die including having one or more voltage conversion circuits for powering various system resources. These voltage conversion circuits, commonly implemented as buck converters for stepping down voltages, conventionally use inductors implemented as SMDs and which are thus disposed as separate components from the power supply die. These inductors may also be disposed as off-chip SMDs for a number of reasons, including mitigation of electromagnetic interference (EMI) with the power supply. However, they also tend to be relatively larger and taller in comparison to other elements in the power supply package or power supply package which can limit the extent to which a power supply package may ultimately be reduced vertically in size. Further, since such inductors are disposed apart from the die to which they are connected, the interconnection distances may limit the related Q (quality factor) of the inductor implementation as well as the amount of possible horizontal size reduction of the power supply package.

Given these difficulties associated with the use of off-chip SMD inductors on an IC, and in particular with buck converters of a power supply, improvements in inductor design and operation are therefore needed.

SUMMARY

The following summary identifies some features and is not intended to be an exclusive or exhaustive description of the disclosed subject matter. Additional features and further details are found in the detailed description and appended claims. Inclusion in the Summary is not reflective of importance. Additional aspects will become apparent to persons skilled in the art upon reading the following detailed description and viewing the drawings that form a part thereof.

In one aspect, a power supply package may include a power management integrated circuit (PMIC) die including a plurality of switching circuits. A first connection and a second connection are provided for each of the plurality of switching circuits. A plurality of 3-dimensional (3D) inductors are disposed around the PMIC die and at least one 3D inductor of the plurality of 3D inductors electrically coupled to the first connection and the second connection of a corresponding switching circuit of the PMIC die.

Another aspect includes a method of fabricating a power supply package including electrically coupling a power management integrated circuit (PMIC) die to a lower redistribution layer (RDL), the PMIC die including a plurality of switching circuits. A plurality of 3-dimensional (3D) inductors are disposed around the PMIC die and electrically coupled to the lower RDL and an upper RDL. At least one 3D inductor of the plurality of 3D inductors is electrically coupled to a corresponding switching circuit of the plurality of switching circuits.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of embodiments of the present disclosure and are provided solely for illustration of the various aspects disclosed and not limitation thereof.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

A power supply package, which includes a power supply integrated circuit on a die is disclosed. The power supply package also be referred to herein as a power management integrated circuit (PMIC) package which may include a PMIC die. It will be appreciated that the specific components of the power supply/PMIC package may vary based on the specific design parameters and the illustrated components are not intended to limit the various aspects disclosed herein. Inductive elements needed in various voltage control circuits, e.g., buck converters, that are conventionally located off-chip, are integrated into the PMIC package as 3D inductors. Advantageous reductions in component height and lateral size are achieved in addition to valuable design and manufacturing efficiencies. Shorter connection distances due to integration result in higher quality factor (Q) for the 3D inductors. 3D inductors may also be easily tailored to specific design and performance needs. Further disclosed are integrated electromagnetic interference (EMI) shields that may be designed and manufactured in a similar way as the 3D inductors with no additional or different processes, thus simplifying design and manufacturing. Additional aspects provide for advantageous depositing of magnetic material at and near positions of the 3D inductors to modify and specify inductive performance.

Figure 1:
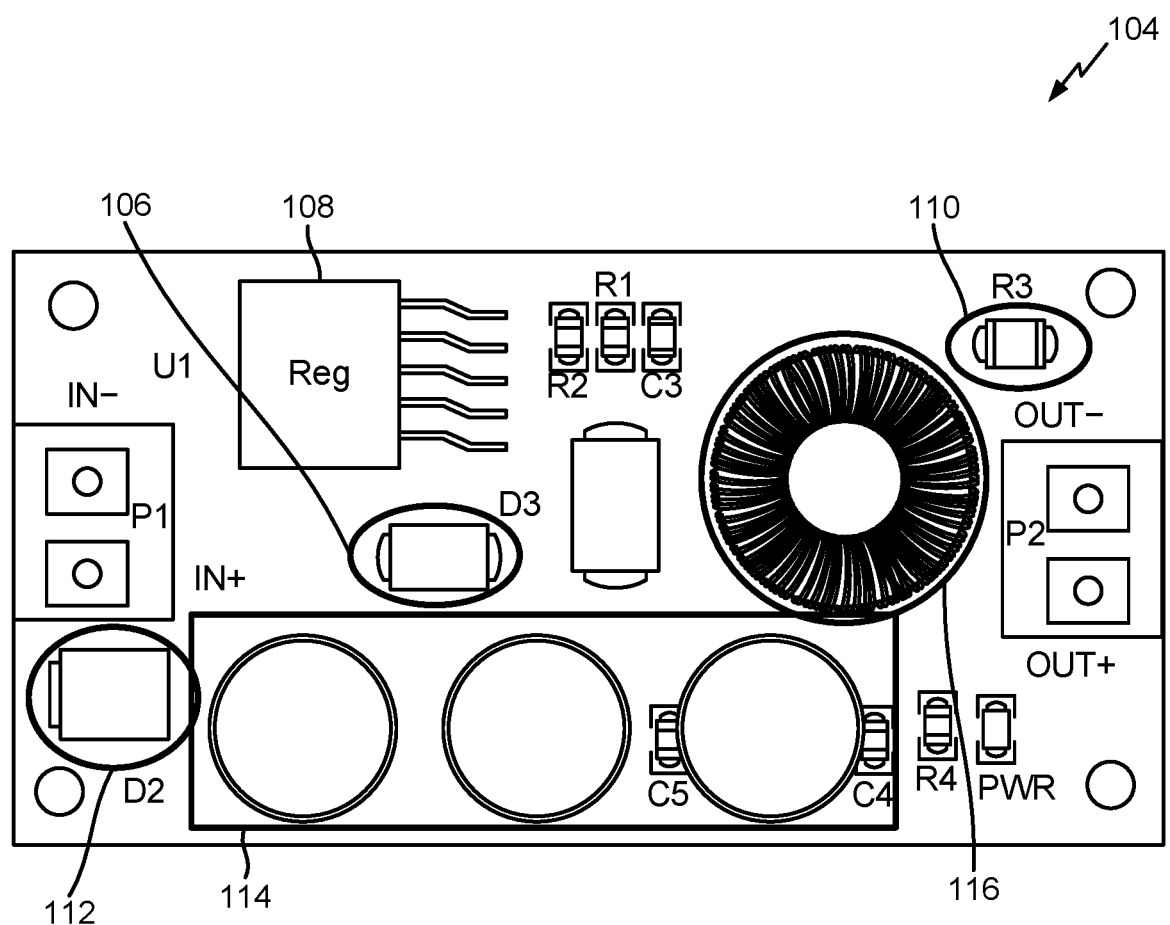
FIG. 1 is an illustration of an example conventional power supply circuit.

FIG. 1 is an illustration of an example of a power supply circuit on a printed circuit board (PCB) 104 with a voltage regulator integrated circuit (IC) 108 as it may be conventionally implemented. The voltage regulator IC 108 is located on the PCB 104, along with other components including an inductor 116, which is large relative to many of the other elements of the PCB 104. For example, over-voltage protection circuit 106, over-current protection component 110 and input reverse polarity protection circuit 112 are each a surface mounted device (SMD) that is smaller than the inductor 116. The high frequency capacitor bank 114 includes several large capacitors and a SMD capacitor C1. FIG. 1 illustrates that inductor 116 consumes a significant portion of the PCB 104, as noted in the background. Additional details of the power supply circuitry will not be discussed.

Figure 2:
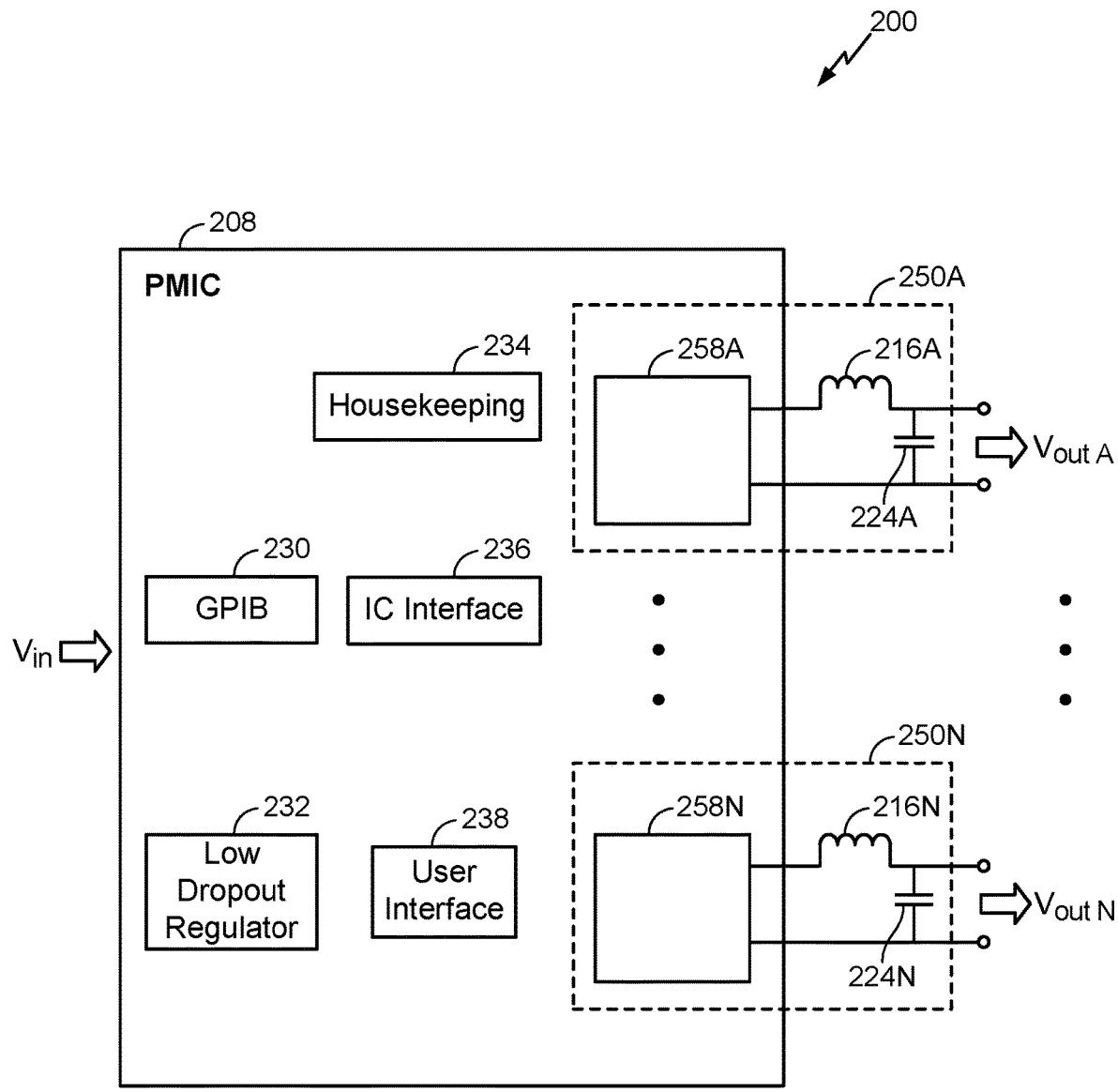
FIG. 2 is a functional block diagram of an example power management integrated circuit (PMIC)

FIG. 2 is a functional block diagram 200 of an example of a power supply package 208 (or PMIC package 208) including a series of buck converters 250A-N. As shown, a generalized input voltage $V_{in}$ is converted to a number of output voltages $V_{outA}$-$V_{outN}$. The output voltages $V_{outA}$-$V_{outN}$ are generated, respectively, by buck converters 250A-N. In an example, the input voltage $V_{in}$ is 5 VDC, and two output voltages $V_{outA}$ and $V_{outB}$ are 1.5 VDC and 3.5 VDC. The buck converters 250A-N include, respectively, inductors 216A-N, capacitors 224A-N, and portions defined herein for ease of disclosure as switching circuits 258A-N (described in more detail below with regard to FIG. 3). As depicted in FIG. 2, for buck converter 250A, for example, the switching circuit 258A is disposed internally and the inductor 216A and capacitor 224A are disposed externally. Performance requirements and manufacturing efficiencies for inductors 216A-N have generally led to elements of comparatively large size that are most easily disposed externally to the PMIC package 208 (i.e., off-chip). As discussed above, the large sizes of such externally disposed inductors 216A-N limit miniaturization of the PMIC package 208.

Other functionalities of the PMIC package 208, which are not necessary for all aspects disclosed, are represented by functional blocks shown in FIG. 2. A general purpose interface bus (GPIB) 230 may be included as a means for communicating with other devices such as a computer or other device. For example, the GPIB 230 may be used for the purposes of testing the PMIC package 208. Also shown are blocks representing functionalities of a low dropout regulator 232, housekeeping 234, which may include sensing circuitry required to regulate and protect a multiple-output power supply (e.g., parameters such as over voltage, under voltage, etc.), an IC interface 236, and a user interface 238.

Figure 3:
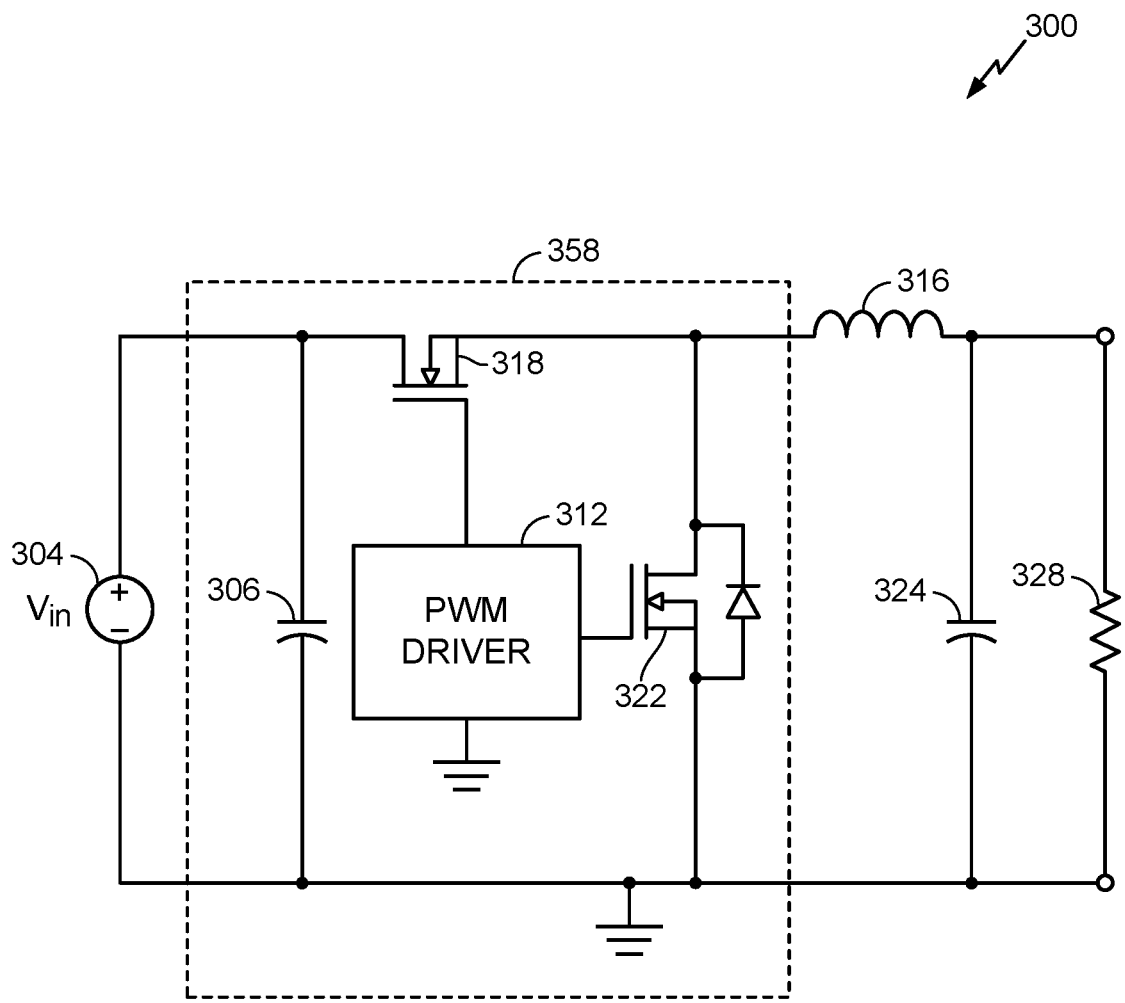
FIG. 3 is a circuit diagram of an example buck converter.

FIG. 3 is a circuit diagram of an example buck converter 300. The following description is provided to illustrate particular aspects disclosed herein. An input voltage $V_{in}$ is applied at input 304, and a stepped down voltage may be seen on output across a load 328. The input voltage is filtered by capacitor 306 to suppress noise on the input signal. Functional operation of transistor 318 and transistor 322, each illustrated as a Metal Oxide Field-Effect Transistor (MOSFET), is performed by a pulse width modulator (PWM) driver 312. The PWM driver 312 imposes a duty cycle on the current at the inductor 316 by controlling the ON/OFF timings for the transistor 318 and transistor 322, and the output voltage across the load 328 is consequently proportional to the duty cycle timing. An external controller (not shown) may be implemented to control the PWM driver 312 for particular duty cycles and hence specific output voltages at the load 328. Due to the step changes to the current that are inherent to the actions at the transistor 318 and transistor 322, switching noise may be introduced into the circuit that in turn leads to electromagnetic interference (EMI) generated at the inductor 316. A capacitor 324 is implemented as a filter to help mitigate such switching noise. However, as discussed above, the inductor 316 may be externally disposed and any EMI generated by the inductor 316 may affect the operation of other elements. Similar to the switching circuits 258A-N in FIG. 2, the switching circuit 358 is defined here, for convenience and clarity of disclosure, as the portion of the buck converter 300 generally disposed internally to a PMIC package 208 and therefore physically separate from the inductor 316.

Figure 4:
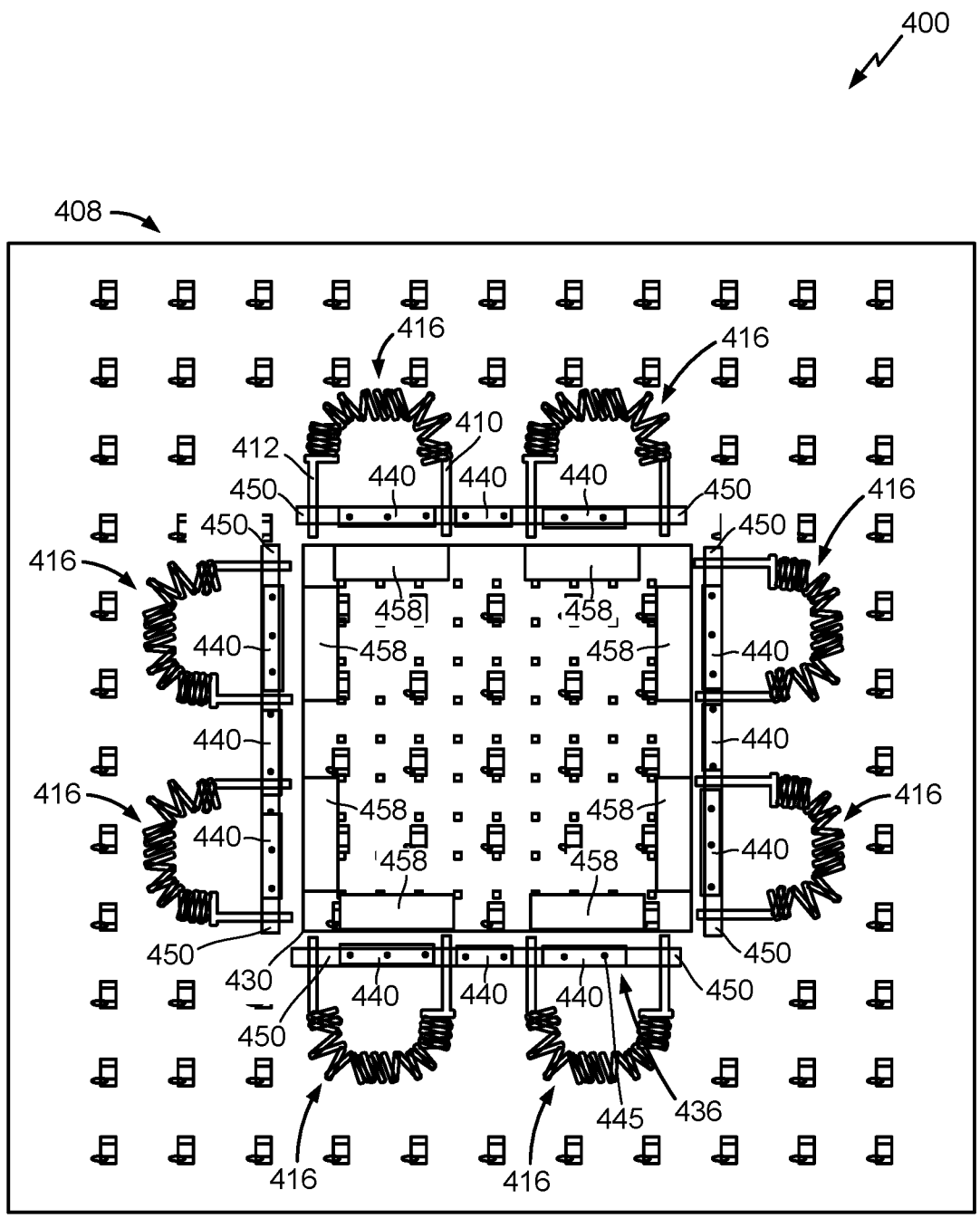
FIG. 4 is a top-view illustration of an example power supply package with PMIC die and 3-dimensional (3D) inductors.

FIG. 4 is a top-view illustration 400 of an example PMIC package 408 with a PMIC die 430 and a plurality of 3-dimensional (3D) inductors 416. The PMIC die 430 includes a plurality of switching circuits 458 (see also the example switching circuit 358, FIG. 3). Each switching circuit 458 includes a first connection 410 and a second connection 412. Here, the first connection 410 is the input to the corresponding 3D inductor 416, and the second connection 412 is the output from the 3D inductor 416. The PMIC package 408 further includes a plurality of 3D inductors 416 disposed around the PMIC die 430 (as used herein the term "around" is not limited to any specific geometric shape and includes, being in proximity, near, etc. and also does not infer completely or substantially surrounding). Each of the plurality of 3D inductors 416 corresponding to a switching circuit 458 and electrically coupled to the first connection 410 and second connection 412 for the corresponding switching circuit 458.

The PMIC package 408 includes a lower redistribution layer (RDL) disposed below the PMIC die 430 and the plurality of 3D inductors 416, and an upper RDL substantially disposed above the PMIC die 430 and the plurality of 3D inductors 416, both comprising conductive traces (e.g., metal traces) for electrically coupling various elements in the PMIC package 408. It will be appreciated that the terms lower RDL and upper RDL are used for convenience and should not be construed literally as some absolute orientation as the orientation and connections may be changed based on various design considerations. For example, a component coupled to the lower RDL in one configuration may be coupled to the upper RDL in another configuration, depending on the routing and design considerations as will be appreciated. Electrical couplings between elements and portions of the 3D inductors 416 may be assumed herein to be formed by use of the lower RDL or an upper RDL disposed above the PMIC die 430 (described below with regard to FIG. 5), or both, unless otherwise specified. In the example of FIG. 4, there are eight 3D inductors 416 disposed uniformly around the PMIC die 430. It will be appreciated that more or fewer such 3D inductors 416 may be implemented in various configurations and the aspects disclosed herein are not limited to any specific configuration. The 3D inductors 416 are electrically coupled with the PMIC die 430, or more specifically with switching circuits (not shown) such as switching circuits 258A-N, 358, disposed internally in the PMIC die 430. Each respective switching circuit may have a corresponding 3D inductor 416. However, it will be appreciated that the number of 3D inductors may vary based on the circuit design and one or more 3D inductors 416 may be coupled to one switching circuit. For consistency herein, input and second connections between a 3D inductor 416 and a switching circuit are defined from the perspective of the 3D inductor 416. That is, first connection 410 carries electrical current to the 3D inductor 416 and second connection 412 carries current from the 3D inductor 416.

For convenience, eight 3D inductors 416 shown in FIG. 4 are drawn identically and distributed uniformly around the PMIC die 430. In particular, the eight 3D inductors 416 are depicted as having a substantially same size and layout, with the same number of coils (or "windings" or "wraps") each formed into a similar shape. It will be understood, however, that to achieve certain design and performance characteristics, implementations may include various numbers of 3D inductors 416 of varying size, positioned uniformly or non-uniformly around the PMIC die 430, having similar or differing layouts, and with the same or differing numbers of coils each formed into similar or differing shapes. Moreover, the physical scales of the 3D inductors 416 and any other elements as depicted in FIG. 4 are depicted by example for illustrative purposes and no explicit dimensions or relative dimensions should be inferred from the illustrated aspects provided herein.

As discussed above, 3D inductors 416 may be subject to switching noise, and due to close proximities, the 3D inductors 416 may have to the PMIC die 430 and its internal circuitry, an EMI shield 436 (e.g., shield ring) may be included to help mitigate any EMI effects on the PMIC die 430. As shown in FIG. 4, an EMI shield 436 may be disposed between the PMIC die 430 and the plurality of 3D inductors 416. Note that EMI shield 436 as depicted includes the elements found in the full EMI shield and is depicted as such for ease of illustration. Further, the discussion herein regarding this portion addresses aspects of the entire EMI shield. The EMI shield 436 comprises a lower EMI shield element 440 and an upper EMI shield element 450, with lower EMI shield elements 440 and upper EMI shield elements 450 disposed peripherally around the PMIC die 430. Lower EMI shield elements 440 may comprise one or more conductive traces of a lower RDL that are electrically coupled with one or more corresponding conductive traces of upper EMI shield elements 450 of an upper RDL. As discussed in more detail below in relation to FIG. 5, the electrical couplings between the lower and upper RDLs may be implemented as a plurality of vertical conductive "pillars" in a fence-like arrangement, electrically coupled to the conductive traces of the upper RDL and the lower RDL. The terms "conductive pillar" and the shorter form "pillar" may be used interchangeably herein. In the top-view of FIG. 4, a top of a generalized conductive pillar 445 is indicated, and it will be understood that tops of the plurality of other conductive pillars 445 are likewise shown on other upper EMI shield elements 450 as depicted.

As shown, a plurality of lower EMI shield elements 440 are disposed with small gaps between the individual lower shield elements. In this example, the gaps allow space for locating first connections 410 and second connections 412 of the 3D inductors 416. These connections may be implemented as conductive traces of the lower RDL. Aspects include, for example, but not by limitation, an EMI shield 436 comprising a lower EMI shield elements 440 formed as an unbroken conductive trace disposed around the PMIC die 430, or as having an overall shape other than rectangular, square, or generally straight-sided as shown in FIG. 4, whether segmented or unbroken.

Figure 5:
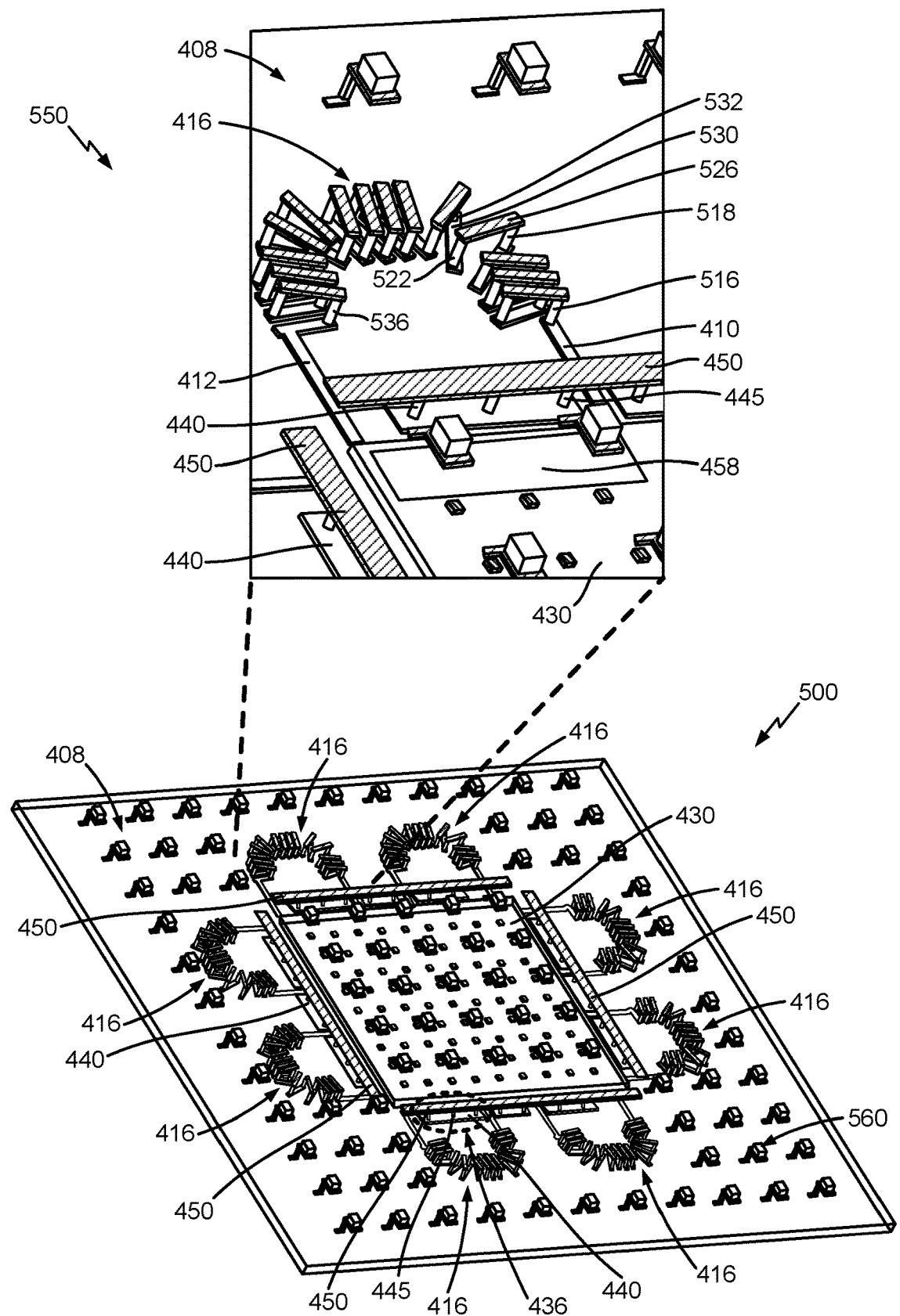
FIG. 5 is an oblique-view illustration of the example power supply package with PMIC die and 3D inductors shown in FIG. 4, including a close view of a 3D inductor.

FIG. 5 includes an oblique view 500 of an example PMIC package 408 with PMIC die 430 and 3D inductors 416 shown by top-view in FIG. 4, and a magnified view 550 of a 3D inductor 416 and related elements. Additionally illustrated are conductive pillars 560 which may only be connected to one RDL, e.g., the lower RDL as illustrated. The elements shown in the oblique view 500 generally echo those shown in the top-view of FIG. 4, with a clearer view of separate lower EMI shield elements 440, upper EMI shield elements 450, and conductive pillars 445. In this example, each upper EMI shield element 450 corresponds with three lower EMI shield elements 440, and substantially parallels on an upper RDL the layout on the lower RDL of corresponding lower EMI shield elements 440. Thus, upper EMI shield elements 450 are part of the upper RDL and as shown are electrically coupled to respective lower EMI shield elements 440 by conductive pillars 445. Aspects of the EMI shield 436 include one or more conductive traces in the upper RDL and lower RDL, with the conductive pillars 445 electrically coupled to conductive traces in both RDLs.

It will be observed that in this example that the lower EMI shield elements 440, upper EMI shield elements 450, and electrically coupled conductive pillars 445 form a fence-like structure substantially disposed between the PMIC die 430 and 3D inductors 416. Such fence-like structures may also be referred to as VIA fences, where VIA stands for "vertical interconnect access," which is an electrical connection through one or more layers in an electronic circuit.

In the magnified view 550 of FIG. 5, a 3D inductor 416 is electrically coupled to the PMIC die 430 (to an internal switching circuit 458, for example, shown in FIG. 4) by first connection 410 and second connection 412, both implemented in this example with conductive traces of the lower RDL.

The 3D inductor 416 comprises a plurality of conductive pillars, such as conductive pillar 518, electrically coupled to conductive portions in the lower RDL and upper RDL. As shown, the plurality of conductive pillars may be disposed in a sequence of pairs of pillars such as conductive pillar 518 and conductive pillar 522. Each pair of pillars in the sequence (e.g., serially connection) may include a first pillar (e.g., conductive pillars 516, 518) and a second pillar (e.g. conductive pillars 522, 536). The initial pillar 516 of a first pair in the sequence of pairs may be electrically coupled by the lower RDL to first connection 410 of a corresponding switching circuit 458. An end pillar 536 of a last pair in the sequence may be electrically coupled by the lower RDL to second connection 412 of the corresponding switching circuit 458. A first pillar 518 of each pair of pillars may be electrically coupled to the second pillar 522 of the same pair by a connection 526 of the upper RDL, and the second pillar 522 of each pair, except for the last pair of the sequence, may be electrically coupled by a connection 530 of the lower RDL to a first pillar 532 of a next pair in the sequence.

The sequence of pairs of pillars as shown in the magnified view 550 of the 3D inductor 416 is disposed substantially in a U-shape or semicircular arrangement to form a U-shaped or semicircular 3D inductor 416. It will be appreciated that other layouts are possible which may be tailored for many reasons, including those related to, but not limited to, requirements of manufacturing, packaging, shielding, and performance, as well as any other characteristics of inductive elements.

FIGS. 6A-F illustrate an example process flow for forming a PMIC package with 3D inductors and EMI shielding. Elements shown in FIGS. 6A-F are simplified 2D illustrations to aid in the discussion of the various figures and are not intended to represent sizes, numbers of elements, specific connections, etc. and should not be construed to limit the various aspects disclosed herein.

Figure 6A:
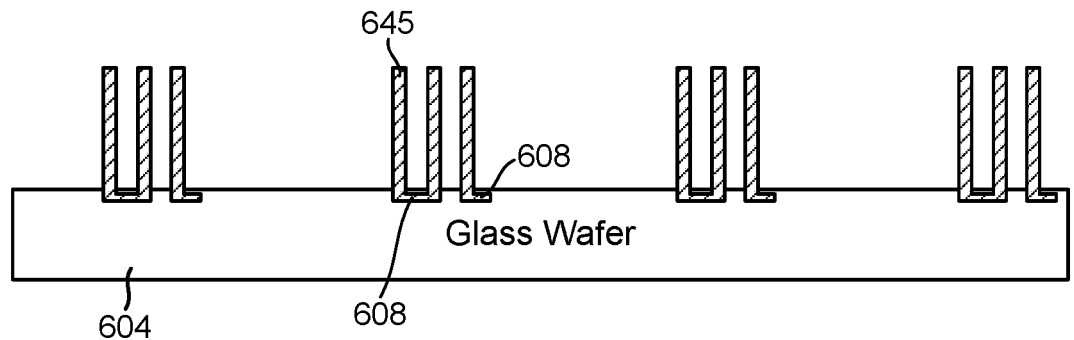
FIGS. 6A-F illustrate an example process flow for forming a power supply package with 3D inductors.

FIG. 6A depicts a substrate 604 (e.g., a glass wafer, high-resistivity-silicon (HRS), Gallium arsenide (GaAs), and the like, which can be processed in wafer format.) having a lower RDL 608, and a plurality of conductive pillars 645 formed in a substantially vertical orientation from lower RDL 608 and electrically coupled to the lower RDL 608. It will be appreciated that the conductive pillars 645 can be used for either the EMI shield 436 (e.g., conductive pillars 445) or the 3D inductor 416 (e.g., pillars 516, 518, 536) as the illustration is solely to provide basic fabrication techniques. For some aspects, the substrate 604 is a glass wafer on which a plurality of PMIC packages 408 is formed. The lower RDL 608 is disposed on the upper surface of the substrate 604, followed by formation of conductive pillars 645 primarily on the lower RDL 608. As is known in the art, the lower RDL 608 may be seen as a system of connections that may be implemented with conductive traces. As shown in FIG. 6A, the plurality of conductive pillars 645 can be grouped into sets representing 3D inductors 416 and EMI shields 436. As discussed above, a lower RDL 608 provides electrical coupling for various elements. It will be appreciated that aspects disclosed herein allow that conductive pillars 645 may be the same for both 3D inductors 416 and EMI shields 436, thus providing manufacturing efficiencies. More specifically, it is more cost and resource effective to design and fabricate both the 3D inductors 416 and EMI shields 436 with conductive pillars and RDL connections, making EMI shielding easier to implement with a VIA fence. Moreover, higher IC integration and higher density inductance are realized as well as improved quality factor (Q) due to reduced connection distances with the 3D inductors 416 according to the various aspects disclosed herein.

In various aspects, the conductive pillars 645 may be constructed in accordance with known wafer processes. Various methods can be used to form the conductive pillars 645 such as, photoresist defined and Cu plating, laser drilling and conductive paste filling, and through substrate vias (TSV)/through-glass vias (TGV) type of forming. For example, a form for a conductive pillar 645 may be created with a photoresist material. The inside of the form may be coated with a conductive material to create the actual conductive pillar 645, after which the photoresist material is stripped or otherwise removed, thus leaving only the conductive pillar 645 remaining. In an example, the inside of the form is plated with copper. In various implementations, the resulting conductive pillars 645 may be 150-200 μm, for example. The 3D inductor can be fabricated using vertical conductive elements generally perpendicular to the lower RDL and the upper RDL, which are coupled to conductive traces in the upper RDL and lower RDL, thereby forming a 3D inductor. In some aspects, the 3D inductor may be formed by drilling holes in a substrate of die (not shown in order to more clearly illustrate the winding structure) and filling them with copper pillars or TSVs, e.g., through-silicon vias, through glass vias, etc., and then coupling the pillars to the conductive traces in the upper RDL and lower RDL, thereby forming a 3D inductor. Accordingly, in another aspect (not shown), the PMIC die 430 and 3D inductors 416 may be disposed within a substrate, such as glass, in which 3D inductors 416 are formed using through-glass vias (TGVs).

Figure 6B:
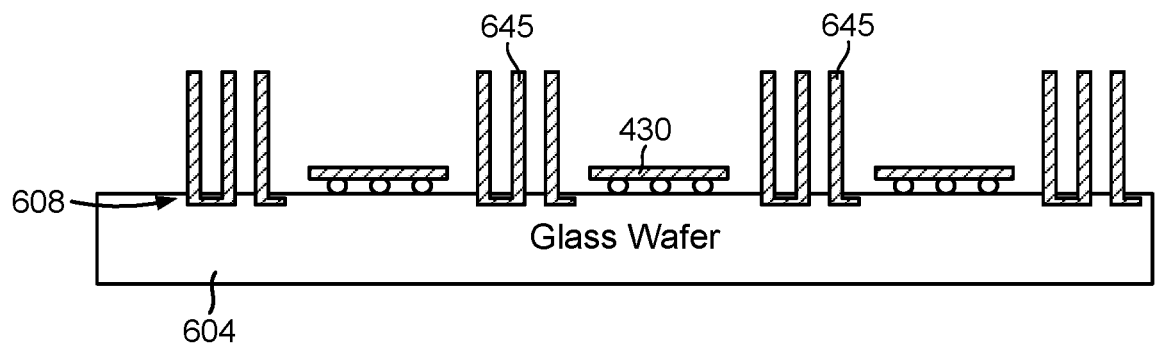

As shown in FIG. 6B, a plurality of PMIC dies 430 are physically and electrically coupled to the lower RDL 608. That is, as in aspects discussed above, pluralities of 3D inductors 416 and EMI shields 436 are disposed peripherally around the associated PMIC die 430 and thus each PMIC die 430 is located as shown between groups of conductive pillars 645.

Figure 6C:
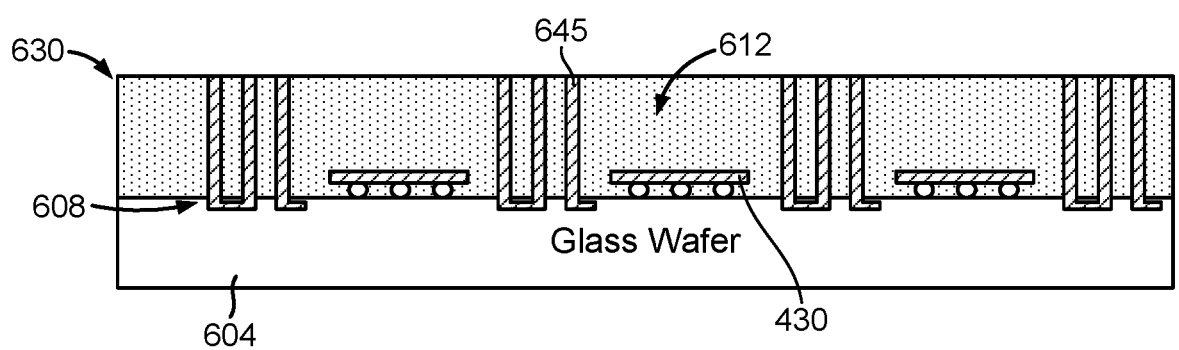

In FIG. 6C, a mold material 612 is applied on the substrate 604 to fill the space between the substrate 604 and the tops of the conductive pillars 645 and thus encase elements on the substrate 604. As will be discussed below, an upper RDL 630 is disposed at around the tops of the conductive pillars 645, and thus the mold material 612 is essentially disposed between the lower RDL 608 and the upper RDL 630. In an aspect, a magnetic material may be disposed in the mold material 612 at or near locations of 3D inductors 416 and/or the EMI shields 436. In this way, inductive characteristics of 3D inductors 416 and EMI shields 436 may be modified to achieve certain performance characteristics.

Figure 6D:
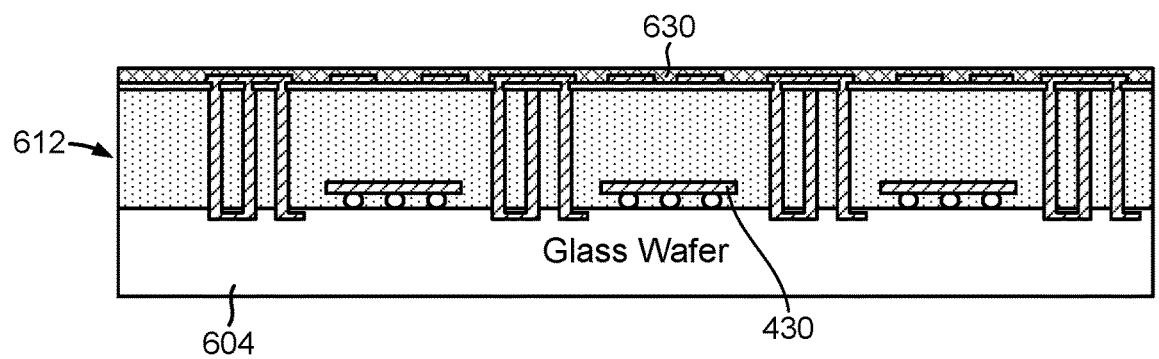

The top surface of the mold material 612, or over molding, may be milled or otherwise reduced to expose tops of the conductive pillars 645. FIG. 6D depicts a passivation layer 620 (e.g. a polyimide material) disposed between the mold material 612 and the upper RDL 630. The passivation layer 620 may be patterned to create various electrical couplings between the RDL 630 and various elements such as, in this example, the conductive pillars 645 and also external connections.

Figure 6E:
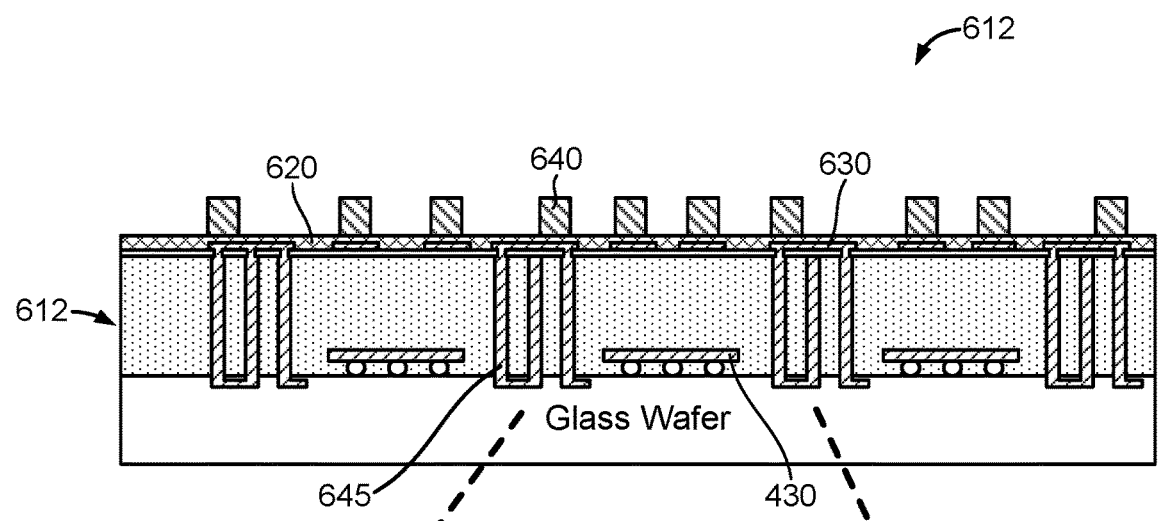

FIG. 6E shows the addition of external connections 640 (e.g., plate solder ball, drop solder balls, etc.) to allow for coupling to external boards and/or connections. It will be appreciated that the illustrated fabrication processes and illustrated elements are represented in a very simplistic 2D representation of the basic fabrication techniques, which would be recognized by those skilled in the art. The interconnections and details of the various layers and elements are not show in detail for simplicity sake. Further, these details tend to vary greatly based on specific circuits and design choices. Accordingly, the illustrated examples should not be construed to be limiting of the various aspects disclosed herein.

Figure 6F:
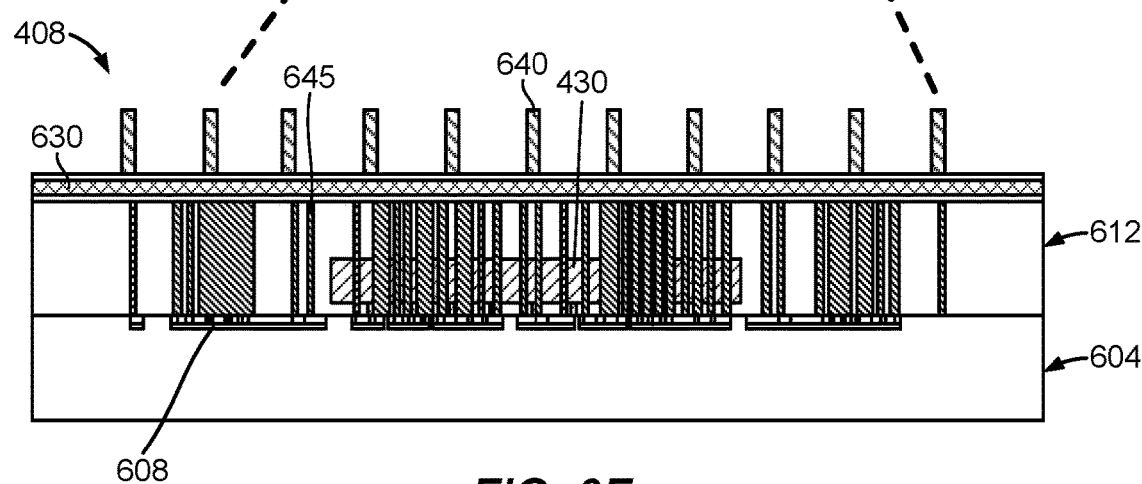

FIG. 6F is an exploded view of a single PMIC package 408 as depicted in FIG. 6E. Following the addition of external connections 640, the substrate 604 may be formed and diced in accordance with wafer-level packaging methods to separate the individual PMIC packages 408. The fuller side view of the final PMIC package 408 illustrates in particular the lower RDL 608 and the positions of the conductive pillars 645 which are used in the fabrication of the pluralities of 3D inductors 416 and EMI shields 436.

It will be understood that 3D inductors 416 implemented in the wafer process as described have improved density and higher accuracy. Moreover, they have a smaller form factor and are easily integrated into the PMIC die 430. EMI shielding between the 3D inductors 416 and the PMIC die 430 is also easily implemented at the same time as the 3D inductors 416, with little additional cost and use of design and manufacturing resources. Further, magnetic material may be introduced into the molding material to boost inductive performance.

Figure 7:
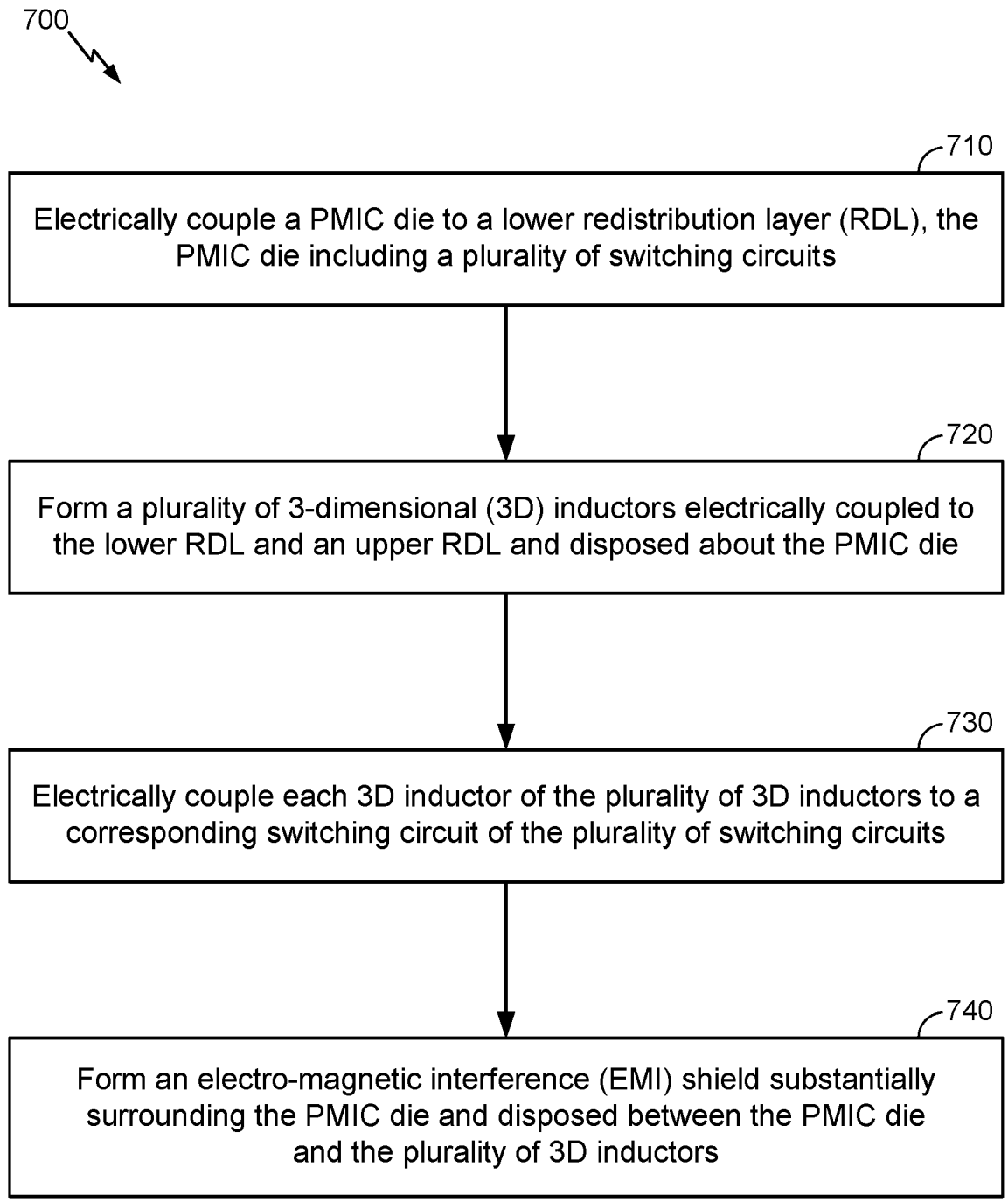
FIG. 7 is a flowchart illustrating an example method of forming a power supply package with 3D inductors.

It will be appreciated that there are various methods for forming a PMIC package including 3D inductors and EMI shields according to aspects disclosed herein. FIG. 7 is a flowchart illustrating an example method 700 in accordance with at least one aspect disclosed. For example, block 710 includes electrically coupling a PMIC die to a lower redistribution layer (RDL), the PMIC die including a plurality of switching circuits. Block 720 includes electrically coupling each 3D inductor of the plurality of 3D inductors to a corresponding switching circuit of the plurality of switching circuits. Block 730 includes electrically coupling each 3D inductor of the plurality of 3D inductors to a corresponding switching circuit of the plurality of switching circuits. And, block 740 includes forming an electro-magnetic interference (EMI) shield disposed between the PMIC die and the plurality of 3D inductors.

Aspects of the method 700 described in FIG. 7 may include forming a plurality of conductive pillars for the plurality of 3D inductors and the EMI shield, and for each pillar of the plurality of conductive pillars forming a photoresist material to define a shape of the conductive pillar, plating the defined shape of the conductive pillar, and removing the photoresist material.

Figure 8:
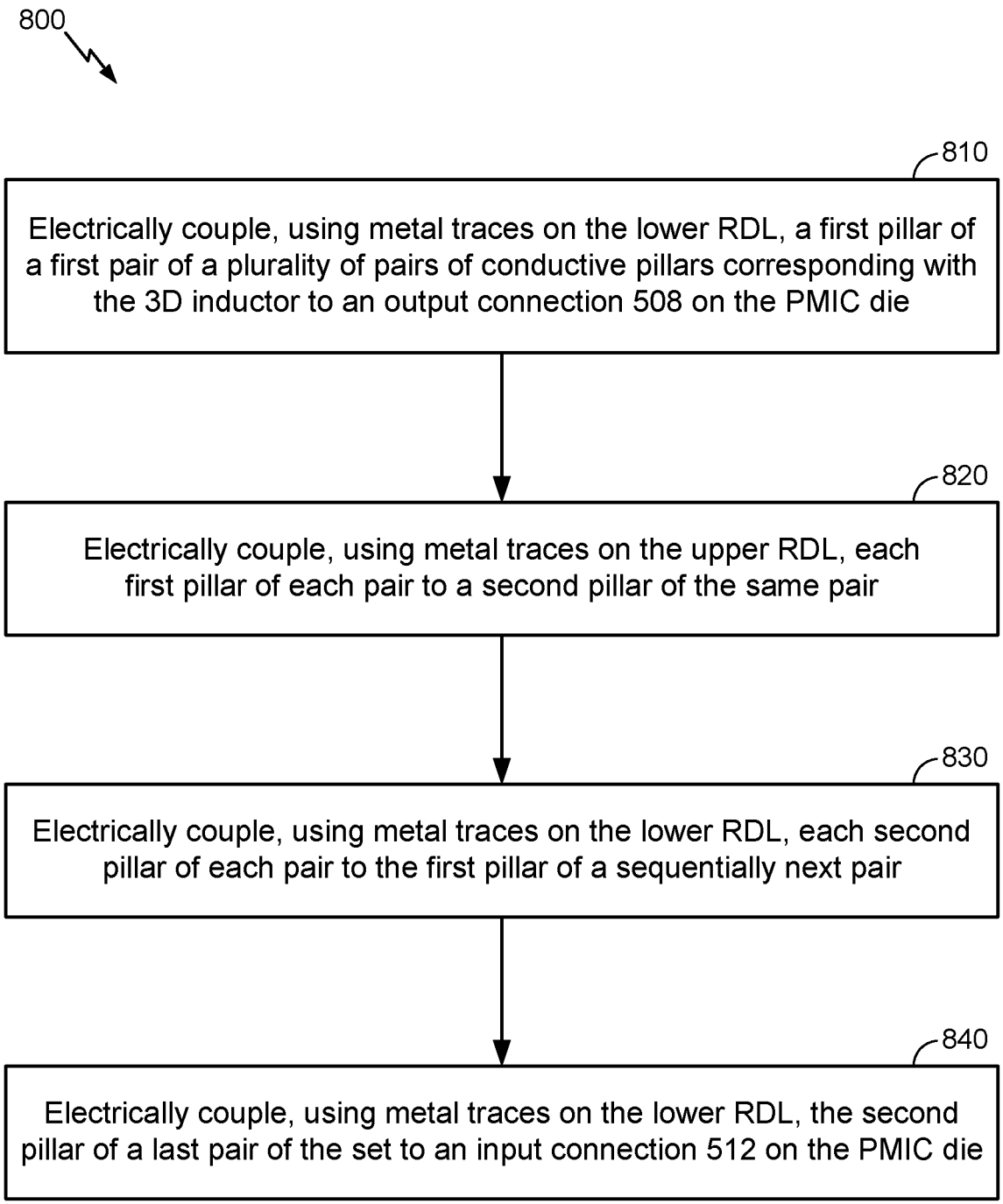
FIG. 8 is a flowchart illustrating an example method of forming a 3D inductor connected to a switching circuit of a PMIC die.

FIG. 8 is a flowchart further illustrating an example method 800 of forming a 3D inductor connected to a switching circuit of a PMIC die. For example, block 810 includes electrically coupling, using the lower RDL, a first pillar of a first pair of the sequence of pairs to the second connection of the corresponding switching circuit. Block 820 includes electrically coupling, using the lower RDL, the second pillar of a last pair of the sequence to the first connection of the corresponding switching circuit. Block 830 includes electrically coupling, using the upper RDL, the first pillar of each pair of the sequence of pairs to a second pillar of the same pair. And, block 840 includes electrically coupling, using the lower RDL, the second pillar of each pair except the last pair of the sequence to the first pillar of a next pair in the sequence.

Aspects of the methods disclosed further include, with regard to forming an EMI shield, forming one or more conductive traces in the lower RDL, forming one or more conductive traces in the upper RDL, and electrically coupling a plurality of conductive pillars to the one or more conductive traces on the upper RDL and to the one or more conductive traces on the lower RDL. A further aspect includes coupling the lower RDL to a glass substrate, where the glass substrate is a wafer and the PMIC package is one of a plurality of PMIC packages disposed in the wafer, and dicing the wafer to separate each PMIC package of the plurality of PMIC packages. Additional aspects include depositing a mold material on the lower RDL, the mold material substantially encasing at least the PMIC die and the plurality of 3D conductive pillars, milling a top surface of the mold material to expose tops of the plurality of conductive pillars, disposing a magnetic material in the mold material at or near locations of 3D inductors, depositing a passivation layer on the top surface of the mold material, physically coupling the upper RDL to the passivation layer, and physically coupling a plurality of solder caps to the upper RDL.

It will be appreciated from the foregoing disclosure that additional processes for fabricating the various aspects disclosed herein will be apparent to those skilled in the art and a literal rendition of the processes discussed above and illustrated in the included drawings will not be provided.

Figure 9:
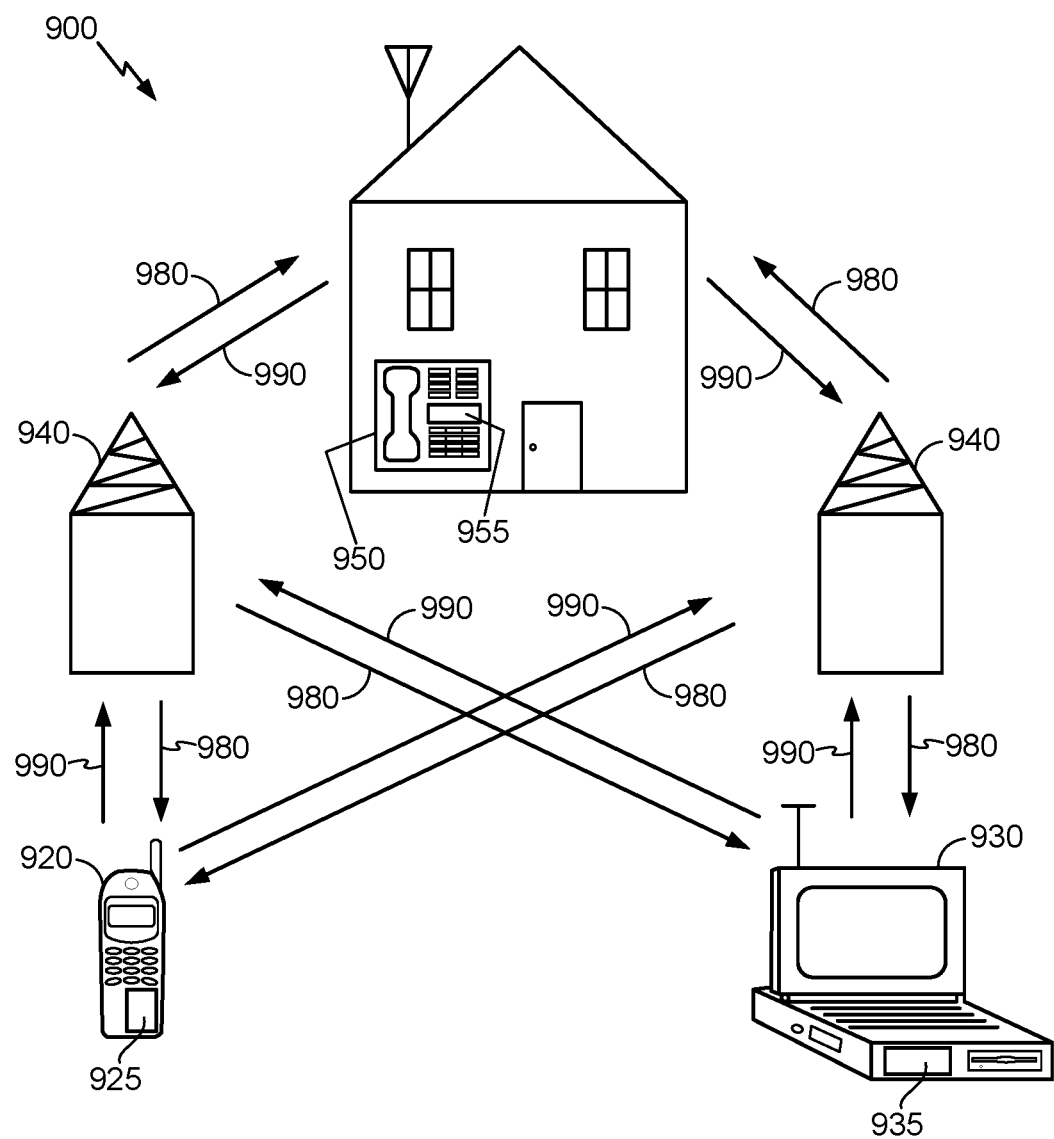
FIG. 9 shows one example functional schematic of devices that can include one or more filters in accordance with some examples of the disclosure.

FIG. 9 illustrates an exemplary communication system 900 in which one or more aspects of the disclosure, e.g., a power supply package, as described in reference to any one or more of FIGS. 2-6F. For purposes of illustration, FIG. 9 shows three remote units 920, 930, and 950 and two base stations 940. It will be recognized that conventional wireless communication systems may have many more remote units and base stations. The remote units 920, 930, and 950 include integrated circuits or other semiconductor devices 925, 935 and 955, respectively, having one or more filters in accordance with one or more of the disclosed exemplary aspects as claimed or as described in reference to any one or more of FIGS. 2-6F. FIG. 9 shows forward link signals 980 from the base stations 940 and the remote units 920, 930, and 950 and reverse link signals 990 from the remote units 920, 930, and 950 to the base stations 940.

In FIG. 9, the remote unit 920 is shown as a mobile telephone, the remote unit 930 is shown as a portable computer, and the remote unit 950 is shown as a fixed location remote unit in a wireless local loop system. These are only examples, both in terms of quantity and type. For example, the remote units 920, 930 and 950 may be one of, or any combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 9 illustrates remote units 920, 930 and 950 according to aspects of the disclosure, the disclosure is not limited to these exemplary illustrated units. Aspects of the disclosure may be suitably employed in any device having active integrated circuitry including memory and on-chip circuitry for test and characterization. Those skilled in the art will appreciate that aspects of the present disclosure may be incorporated into integrated devices, such as a mobile phone, which incorporate RF (Radio Frequency) communications in order to separate different frequency RF signal bands.

For example, the components (e.g., 408) disclosed herein may be incorporated into a device that may include a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, or a device in an automotive vehicle. Further, it will be appreciated that aspects of the present disclosure may be used a wide variety of devices and are not limited to the specific examples provide herein.

The foregoing disclosed devices and functionalities, e.g., as described in reference to any one or more of FIGS. 2-6F may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a semiconductor chip. The chips are then employed in devices described above.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, embodiments disclosed herein can include a non-transitory computer-readable media embodying a method for fabricating the various filters. Accordingly, the disclosure is not limited to illustrated examples as any means for performing the functionality described herein are contemplated by the present disclosure.

While the foregoing disclosure shows various illustrative embodiments, it should be noted that various changes and modifications could be made herein without departing from the scope of the teachings of the present disclosure as defined by the appended claims. The functions, steps and/or actions of the method claims in accordance with the embodiments of the disclosure described herein need not be performed in any particular order. Furthermore, although elements of the present disclosure may be described or claimed in the singular, the plural is contemplated unless limitation to the singular is explicitly stated.

What is claimed is:

1. A power supply package, comprising:
   a power management integrated circuit (PMIC) die including a plurality of switching circuits;
   a first connection and a second connection for each of the plurality of switching circuits;
   a plurality of 3-dimensional (3D) inductors disposed around the PMIC die, at least one 3D inductor of the plurality of 3D inductors electrically coupled to the first connection and the second connection of a corresponding switching circuit of the PMIC die;
   a lower redistribution layer (RDL) disposed below the PMIC die; and
   an upper RDL disposed above the PMIC die.

2. The power supply package of claim 1, wherein each 3D inductor of the plurality of 3D inductors comprises a plurality of conductive pillars electrically coupled to the lower RDL and the upper RDL.

3. The power supply package of claim 2, wherein the plurality of conductive pillars is disposed in a U-shape or semicircular arrangement to form a U-shaped or semicircular 3D inductor.

4. The power supply package of claim 3, wherein each 3D inductor further comprises:
   a plurality of windings formed by pairs of conductive pillars each including a first conductive pillar and a second conductive pillar;
   wherein the first conductive pillar of a first pair is electrically coupled to the first connection of the corresponding switching circuit by the lower RDL;
   wherein the second conductive pillar of a last pair is electrically coupled to the second connection of the corresponding switching circuit by the lower RDL;
   wherein the first conductive pillar of each pair is electrically coupled to the second conductive pillar of the same pair by the upper RDL; and
   wherein the second conductive pillar of each pair except the last pair of the 3D inductor is electrically coupled to the first conductive pillar of a next pair by the lower RDL.

5. The power supply package of claim 1, further comprising an electromagnetic interference (EMI) shield disposed between the PMIC die and at least one of the plurality of 3D inductors.

6. The power supply package of claim 5, wherein the EMI shield comprises:
   one or more conductive traces in the upper RDL; and
   one or more conductive traces in the lower RDL.

7. The power supply package of claim 6, wherein the EMI shield further comprises a plurality of conductive pillars electrically coupled to the one or more conductive traces on the upper RDL and the one or more conductive traces on the lower RDL.

8. The power supply package of claim 1, further comprising a substrate disposed below the lower RDL wherein the substrate is formed of glass, high-resistivity-silicon (HRS) or Gallium arsenide (GaAs).

9. The power supply package of claim 1, further comprising a mold material disposed between the lower RDL and the upper RDL.

10. The power supply package of claim 9, further comprising magnetic material disposed in the mold material at or near a location of at least one 3D inductor of the plurality of 3D inductors.

11. The power supply package of claim 9, further comprising a passivation layer disposed between the mold material and the upper RDL.

12. The power supply package of claim 1, further comprising a substrate in which the PMIC die and 3D inductors are disposed, wherein the substrate is glass and the 3D inductors are formed using through glass vias (TGVs).

13. The power supply package of claim 1, wherein the power supply package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a component in an automotive vehicle.

* * * * *